(12) United States Patent
Brown et al.

(10) Patent No.: US 10,553,781 B2
(45) Date of Patent: Feb. 4, 2020

(54) IN-SITU ANNEALING AND ETCH BACK STEPS TO IMPROVE EXCHANGE STIFFNESS IN COBALT IRON BORIDE BASED PERPENDICULAR MAGNETIC ANISOTROPY FREE LAYERS

(71) Applicant: INTERNATIONAL BUSINESS MACHINES CORPORATION, Armonk, NY (US)

(72) Inventors: Stephen L. Brown, Carmel, NY (US); Guohan Hu, Yorktown Heights, NY (US); Jonathan Z. Sun, Shrub Oak, NY (US); Daniel C. Worledge, Cortlandt Manor, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/467,609

(22) Filed: Mar. 23, 2017

(65) Prior Publication Data

US 2017/0194556 A1   Jul. 6, 2017

Related U.S. Application Data

(62) Division of application No. 14/883,283, filed on Oct. 14, 2015, now Pat. No. 10,374,145.

(51) Int. Cl.
*H01L 43/02* (2006.01)
*H01L 27/22* (2006.01)
(Continued)

(52) U.S. Cl.
CPC ............ *H01L 43/02* (2013.01); *H01L 27/222* (2013.01); *H01L 43/08* (2013.01); *H01L 43/10* (2013.01); *H01L 43/12* (2013.01)

(58) Field of Classification Search
CPC ....... H01L 43/12; H01L 43/08; H01L 27/222; H01L 27/43; H01L 27/02; H01L 27/10
See application file for complete search history.

(56) References Cited

U.S. PATENT DOCUMENTS 7,863,060 B2   1/2011   Belen et al.
8,037,593 B2   10/2011  Ho et al.
(Continued)

OTHER PUBLICATIONS

List of IBM Patents or Patent Applications Treated as Related dated Mar. 23, 2017, 2 pages.
(Continued)

*Primary Examiner* — Matthew C Landau
*Assistant Examiner* — Mark Hatzilambrou
(74) *Attorney, Agent, or Firm* — Tutunjian & Bitetto, P.C.; Vazken Alexanian

(57) ABSTRACT

A method for forming a memory device that includes providing a free layer of an alloy of cobalt (Co), iron (Fe) and boron (B) overlying a reference layer; and forming metal layer comprising a boron (B) sink composition atop the free layer. Boron (B) may be diffused from the free layer to the metal layer comprising the boron sink composition. At least a portion of the metal layer including the boron (B) sink composition is removed. A metal oxide is formed atop the free layer. The free layer may be a crystalline cobalt and iron alloy. An interface between the metal oxide and free layer can provide perpendicular magnetic anisotropy character.

19 Claims, 1 Drawing Sheet

(51) Int. Cl.
*H01L 43/10* (2006.01)
*H01L 43/12* (2006.01)
*H01L 43/08* (2006.01)

(56) References Cited

U.S. PATENT DOCUMENTS

| | | |
|---|---|---|
| 8,591,751 B2 | 11/2013 | Zhang et al. |
| 8,758,850 B2 | 6/2014 | Zhou et al. |
| 2009/0229111 A1 | 9/2009 | Zhao et al. |
| 2012/0205758 A1 | 8/2012 | Jan et al. |
| 2013/0264665 A1 | 10/2013 | Jan et al. |
| 2014/0175581 A1* | 6/2014 | Guo ................ H01L 43/08 257/421 |
| 2017/0110506 A1* | 4/2017 | Brown ............. H01L 27/222 |

OTHER PUBLICATIONS

Natarajarathinam et al., "Influence of capping layers on CoFeB anisotropy and damping" Journal of Applied Physics, vol. 112, No. 5, Sep. 2012. (4 pages).

Sinha et al., "Influence of boron diffusion on the perpendicular magnetic anisotropy in Ta|CoFeB|MgO ultrathin films" Journal of Applied Physics, vol. 117, No. 4, Jan. 2015. (6 pages).

Watanabe et al., "Dependence of magnetic properties of MgO/CoFeB/Ta stacks on CoFeB and Ta thicknesses" Japanese Journal of Applied Physics, vol. 54, No. 4S, Mar. 2015. (3 pages).

* cited by examiner

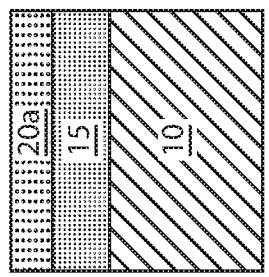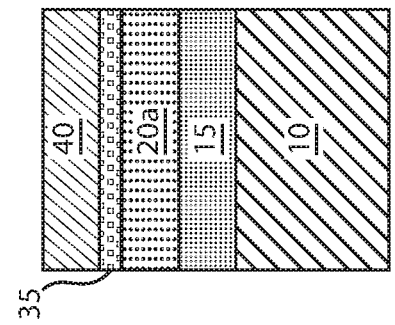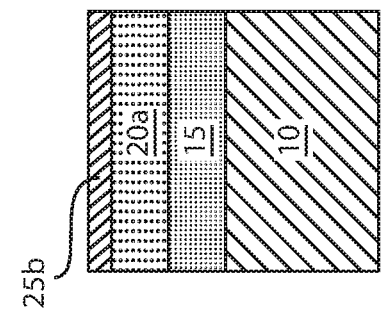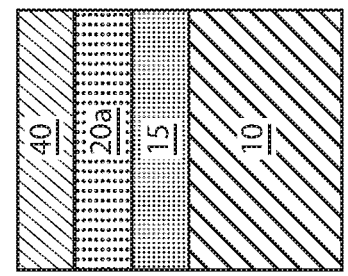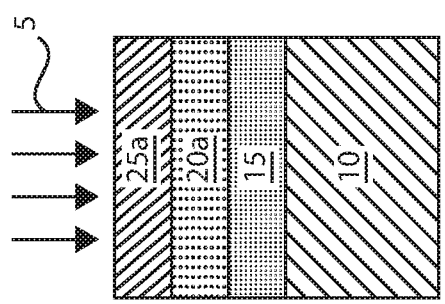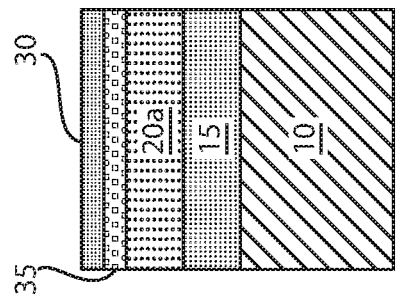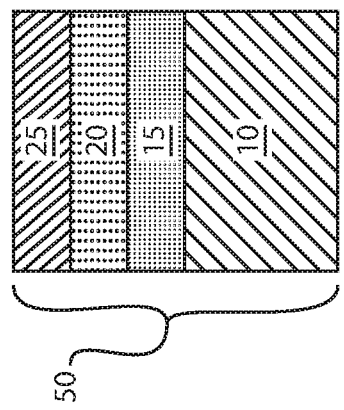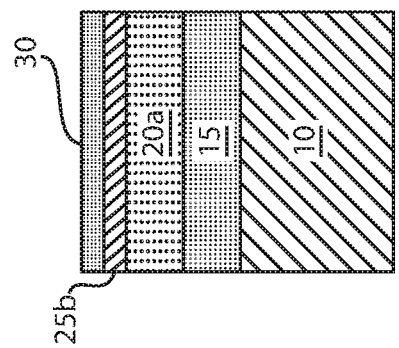

IN-SITU ANNEALING AND ETCH BACK STEPS TO IMPROVE EXCHANGE STIFFNESS IN COBALT IRON BORIDE BASED PERPENDICULAR MAGNETIC ANISOTROPY FREE LAYERS

BACKGROUND

Technical Field

The present invention relates to magnetic random access memory devices and apparatuses, and more particularly to increasing the magnetic exchange stiffness of material layers used in magnetic random access memory devices.

Description of the Related Art

Magnetic random access memory (MRAM) devices differ from conventional random access memory (RAM) in that data is stored through the use of magnetic elements as opposed to storing data through electric charges or current flows. In accordance with MRAM, two magnetic elements are separated by a barrier. In addition, one of the magnetic elements can be a permanent magnet set to a fixed polarity while the polarity of the other magnetic element is adaptable to store data. The different digital states (i.e. one or zero) can be differentiated by assessing whether the polarity of the two elements are the same or different. Data can be read by measuring the electrical resistance of the cell. For example, a transistor can switch a current through the cell such that charge carriers tunnel through the barrier in accordance with the tunnel magneto resistance effect. The resistance of the cell is dependent on the magnetic moments of the two elements. Writing data in an MRAM can be conducted using a variety of methods. Spin transfer torque (STT), which employs a spin polarized current, is one such method.

In accordance with STT, the spin-polarized current is altered as it passes through the adaptable magnetic element, thereby applying a torque to the magnetic element and changing its polarity. Further, there are multiple types of STT MRAM devices. For example, reference layers and free layers of in-plane STT MRAMs have magnetic moments that are parallel to the wafer plane. Alternatively, reference layers and free layers of Perpendicular Magnetic Anisotropy (PMA) STT MRAMs have magnetic moments that are perpendicular to the wafer plane.

SUMMARY

In one embodiment, a method is provided for forming a memory device that includes providing a free layer of an alloy of cobalt (Co), iron (Fe) and boron (B) overlying a reference layer. A metal layer comprising a boron (B) sink composition may be deposited atop the free layer. An anneal process diffuses boron (B) from the free layer to the metal layer comprising the boron sink composition. At least a portion of the metal layer including the boron (B) sink composition is removed. A metal oxide is formed atop the free layer, wherein the free layer comprises a crystalline cobalt and iron alloy and an interface between the metal oxide and free layer provides perpendicular magnetic anisotropy character.

In another embodiment, a method is provided for forming a memory device that includes providing a free layer of an alloy of cobalt (Co), iron (Fe) and boron (B) overlying a reference layer. A metal layer comprising a boron (B) sink composition may be deposited atop the free layer. An anneal process diffuses boron (B) from the free layer to the metal layer comprising the boron sink composition. The metal layer including the boron (B) sink composition is removed. An alloy layer of cobalt and iron is formed atop an exposed surface of the free layer. A metal oxide is formed by oxidation anneal atop the free layer. The free layer comprises a crystalline cobalt and iron alloy and an interface between the metal oxide and free layer provides perpendicular magnetic anisotropy character.

In another aspect, a memory device is provided that includes a magnesium oxide tunnel layer atop a reference layer, and a crystalline free layer comprised of cobalt and iron alloy that is substantially free of boron, wherein the crystalline free layer is substantially lattice matched to the magnesium oxide tunnel layer. A metal oxide layer may be present on the opposite surface of the crystalline free layer to provide an oxide interface on opposing surfaces of the crystalline free layer in order to generate perpendicular magnetic anisotropy character.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein:

FIG. 1 is a side cross-sectional view depicting one embodiment of forming a material stack including a free layer of an alloy of cobalt (Co), iron (Fe) and boron (B) overlying a reference layer, and a metal layer comprising a boron (B) sink composition may be deposited atop the free layer, in accordance with the present disclosure.

FIG. 2 is a side cross-sectional view depicting an anneal process to diffuse boron (B) from the free layer to the metal layer comprising the boron sink composition, in accordance with the present disclosure.

FIG. 3A is a side cross-sectional view depicting one embodiment of etching a portion of the metal layer including the boron (B) sink composition from the structure depicted in FIG. 2.

FIG. 3B is a side cross-sectional view depicting one embodiment of removing an entirety of the metal layer including the boron (B) sink composition from the structure depicted in FIG. 2.

FIG. 4A is a side cross-sectional view depicting forming a regrowth metal layer on the remaining portion of the metal layer including the boron (B) sink composition that is depicted in FIG. 3A.

FIG. 4B is a side cross-sectional view depicting forming a cobalt (Co) and iron (Fe) containing alloy on the free layer that is depicted in FIG. 3B, in accordance with one embodiment of the present disclosure.

FIG. 5A is a side cross-sectional view depicting forming a metal oxide atop the free layer that is depicted in FIG. 4A, wherein the free layer comprises a crystalline cobalt and iron alloy and an interface between the metal oxide and free layer provides perpendicular magnetic anisotropy character.

FIG. 5B is a side cross-sectional view depicting forming a metal oxide atop the cobalt (Co) and iron (Fe) containing alloy that is depicted in FIG. 4B, wherein the free layer comprises a crystalline cobalt and iron alloy and an interface between the metal oxide and free layer provides perpendicular magnetic anisotropy character.

DETAILED DESCRIPTION OF PREFERRED EMBODIMENTS

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

As used herein, the term "memory device" means a structure in which the electrical state can be altered and then retained in the altered state, in this way a bit of information can be stored. Spin torque transfer magnetic random access memory (STT MRAM) uses magnetic materials as the memory storage element. In some examples, STT MRAM uses memory storage elements that take advantage of the effect in which a current that is passed through a magnetic material, such as a magnetic tunnel junction (MTJ)—reverses its direction of magnetization. Passing a current through the MTJ causes its direction of magnetization to switch between a parallel or anti-parallel state, which has the effect of switching between low resistance and high resistance. Because this can be used to represent the 1s and 0s of digital information, STT MRAM can be used as a nonvolatile memory.

Reading STT MRAM involves applying a voltage to the MTJ to discover whether the MTJ offers high resistance to current ("1") or low ("0"). Typically, a MTJ stack includes reference layer(s) (also referred to as pinned layer), tunnel layer(s) and free layer(s). A typical MTJ stack is usually configured such that the reference layer and tunnel barrier are disposed beneath the free layer. It should be noted that exemplary materials for the free layer(s) include alloys and/or multilayers of Fe, Ni, Co, Cr, V, Mn, Pd, Pt, B, O and/or N. Further, the reference layer(s) can be composed of alloys and/or multilayers of Fe, Ni, Co, Cr, B, Mn, Pt, Pd, Ru, Ta, W and/or Cu. Moreover, the tunnel barrier layer(s) can be composed of MgO, $Al_2O_3$, $TiO_2$, or materials of higher electrical tunnel conductance, such as semiconductors or low-bandgap insulators. A spin torque MRAM uses a 2 terminal device with a pinned layer, tunnel barrier, and free layer in a magnetic tunnel junction stack. The magnetization of the pinned layer is fixed in direction (say pointing up) and a current passed down through the junction makes the free layer parallel to the pinned layer, while a current passed up through the junction makes the free layer anti-parallel to the pinned layer. A smaller current (of either polarity) is used to read the resistance of the device, which depends on the relative orientations of the magnetizations of the free and pinned layers. The resistance is typically higher when the magnetizations are anti-parallel, and lower when they are parallel (though this can be reversed, depending on the material).

Cobalt iron boride (CoFeB) with double oxide interfaces has been shown to be free layer material for STT-MRAM applications. In this material system, the perpendicular magnetic anisotropy (PMA) performance is generated from both of the oxide interfaces, with one being the tunnel barrier layer, e.g., an interface with a magnesium oxide (MgO) tunnel barrier layer. The other oxide layer being a cap or seed can be various different kinds of oxide, for example, MgO, MgTi Ox, MgTa Ox, Ti oxide and Ta oxide, etc. Reference layers and free layers of Perpendicular Magnetic Anisotropy (PMA) STT MRAMs have magnetic moments that are perpendicular to the wafer plane.

In accordance with the methods and structures of the present disclosure, compared to tantalum (Ta) capped free layer, free layers with double oxide interfaces showed stronger PMA and lower damping, thus better switching performance. However, it has been determined that an oxide cap is not as good a boron (B) sinking material as a metal cap, for example a tantalum (Ta) metal cap, which can hurt both tunnel magnetoresistance (TMR) and free layer exchange stiffness. High TMR is desired for read operations in memory devices, such as STT MRAM devices. High exchange stiffness is beneficial for greater than sub 20 nm small devices.

In some embodiments, the present disclosure provides a method to improve TMR and free layer exchange stiffness in stacks where the free layer has double oxide interfaces. In some embodiments, the method includes forming a cobalt iron boride (CoFeB) based magnetic layer capped with a metal layer that acts as a boron (B) sink during subsequent annealing processes. As will be described in greater detail below, some metals suitable for use in the metal layer used as the boron (B) sink can include titanium (Ti), tantalum (Ta), zirconia (Zr) and alloy thereof. In a following anneal process, the boron (B) from the free layer of CoFeB diffuses into a top metal layer and leaves crystalline cobalt iron (CoFe) alloys as the magnetic free layer. In some embodiments, the formation of the crystalline cobalt iron alloy improves the exchange stiffness of the free layer. In a following process step, an in situ etch back process removes at least a portion of the metal layer that provides the boron sink, which removes a portion of the boron that has diffused to the metal layer. A metal oxide may then be formed, which can include a remaining portion of the metal layer, which gives rise to PMA. In some embodiments prior to forming the metal oxide layer, a metal layer may be deposited, such as CoFe, Fe or CoFeB, and then a layer of oxide can be formed by RF sputtering. This can allow the free layer to crystallize from the barrier interface for high TMR and can also improve the free layer exchange stiffness, as the B content decreases in the free layer. Further details of the methods and structures of the present disclosure are discussed blow with reference to FIGS. 1-5B.

FIG. 1 depicts one embodiment of forming a material stack 50 including a free layer 20 of an alloy of cobalt (Co), iron (Fe) and boron (B) overlying a reference layer 10, and a metal layer 25 comprising a boron (B) sink composition may be deposited atop the free layer 20.

The reference layer 10 may be composed of any magnetic material that can have a magnetic direction that can be fixed, e.g., to provide a fixed or pinned magnetic direction for use the in the reference layer 10 of a memory device, e.g., STT MRAM device. In some examples, the reference layer 10 may be composed of alloys of Fe, Ni, Co, Cr, B, Mn, Pt, Pd, Ru, Ta, W and/or Cu combined with a multilayer structure made of alternating layers of Co, Ni, Pt, Pd, Ir and Ru etc with strong perpendicular magnetic anisotropy or alloys with strong perpendicular anisotropy, such as CoFeTb, CoFeGd or CoCrPt, CoPt, CoPd, FePt, FePd. The reference layer 10 may be composed of a single material layer or may be composed of multiple material layers. In some embodiments, the reference layer 10 may have a thickness ranging from 15 Å to 200 Å. Although not depicted in the supplied figures, the reference layer 10 may be formed on an electrically conductive electrode, or may be present on a substrate. The reference layer 10 can be formed using a deposition method, such as physical vapor deposition (PVD), e.g., plating, electroless plating, electroplating, sputtering and combinations thereof. In other embodiments, the reference layer 10 may be deposited using chemical vapor deposition (CVD).

A tunnel barrier layer 15 is present between the reference layer 10 and the free layer 20 of the alloy of cobalt (Co), iron (Fe) and boron (B). The tunnel barrier layer 15 may be hereafter referred to as a metal oxide layer 15, and may have a thickness to promote tunneling. The metal oxide layer 15 in combination with the reference layer 10 may produce a spin torque that can change the direction of magnetization in the free layer 20 of the alloy of cobalt (Co), iron (Fe), and boron (B), in which directional changes in the magnetization direction of the free layer is one mechanism that can provide the memory functions of a STT MRAM. In some embodiments, when the metal oxide layer 15 is a magnesium oxide containing layer, the metal oxide layer 15 may be magnesium oxide (MgO). It is noted that the above compositions for the metal oxide layer 15 have been provided for illustrative purposes, and it is not intended to limit the scope of the present disclosure to only these materials. For example, in some instances, the tunnel barrier layer provided by the metal oxide layer 15 can be composed of $Al_2O_3$, $TiO_2$, and combinations thereof. The metal oxide layer 15 may have a thickness ranging from 5 Å to 20 Å. The metal oxide layer 15 may be formed using a deposition technique, such as physical vapor deposition (PVD), e.g., plating, electroless plating, electroplating, sputtering and combinations thereof, or chemical vapor deposition, such as metal organic chemical vapor deposition (MOCVD) or plasma enhanced chemical vapor deposition (PECVD).

The free layer 20 that is composed of the alloy of cobalt (Co), iron (Fe) and boron (B) may have a magnetic direction that can be switched in a manner that can provide a memory mechanism for STT MRAMs. In some embodiments, the free layer 20 that is composed of an alloy of cobalt (Co), iron (Fe), and boron (B) may have the composition of $Co_{60}Fe_{20}B_{20}$. It is noted that this is only one example of an alloy of cobalt (Co), iron (Fe) and boron (B) that can provide the free layer 20. Other compositions are equally suitable for the free layer 20 that is composed of the alloy of cobalt (Co), iron (Fe) and boron (B). It is noted that prior to the following described anneal process the boron (B) of the free layer 20 that is composed of the alloy of cobalt (Co), iron (Fe) and boron (B) is greater than 15 at. %. For example, the boron content may range from 15 at. % to 30 at. % in the free layer that is composed of the alloy of cobalt (Co), iron (Fe), and boron (B) prior to the below described anneal process. In other examples, the boron content may range from 20 at. % to 25 at. % in the free layer that is composed of the alloy of cobalt (Co), iron (Fe), and boron (B) prior to the anneal process.

As will be discussed below, the boron (B) concentration of the free layer 20 will be reduced by the annealing to diffuse the boron (B) from the free layer 20 that is composed of cobalt (Co), iron (Fe) and boron (B) in to the metal layer 25 that acts as a boron (B) sink.

The free layer 20 that is composed of the alloy of cobalt (Co), iron (Fe) and boron (B) may be formed using a deposition process, such as physical vapor deposition (PVD), which can include sputtering, plasma enhanced chemical vapor deposition (PECVD), metal organic chemical vapor deposition (MOCVD) and combinations thereof. The free layer 20 may have a thickness ranging from 5 Å to 30 Å. In another embodiment, the free layer 20 may have a thickness ranging from 10 Å to 20 Å. In one example, the free layer 20 may have a thickness of 15 Å.

In some embodiments, the first step of a process flow in accordance with the present disclosure is to grow the CoFeB based magnetic layer (also referred to as a free layer 20 of an alloy of cobalt (Co), iron (Fe) and boron (B)) capped with a relatively thick metal layer (also referred to as a metal layer 25 comprising a boron (B) sink composition). For example, by relatively thick it can be meant that the thickness of the metal layer 25 including the boron (B) sink composition may range from 5 Å to 25 Å. In another embodiment, the metal layer 25 including the boron (B) sink composition may range from 10 Å to 20 Å. In one example, the metal layer 25 including boron (B) sink composition may have a thickness of 15 Å.

In some embodiments, the metal layer 25 acts as a boron (B) sink during the subsequent annealing process that is described below. By "boron (B) sink" it is meant that the material attracts boron (B) that is diffusing from the free layer 20 of an alloy of cobalt (Co), iron (Fe) and boron (B), in which the boron diffuses into the boron (B) sink material. Some examples of metals that are suitable for the metal layer 25 including the boron (B) sink composition include titanium (Ti), tantalum (Ta), zirconium (Zr) or alloys containing those. In one example, the metal layer 25 is composed of tantalum (Ta) that is formed directly on a free layer 20 of CoFeB. It is noted that the above list of metal compositions for the metal layer 25 that acts as a boron (B) sink is provided for illustrative materials only, and is not intended to limit the present disclosure, as other materials are equally suitable, so long as boron diffused to the material composition selected, as part of the following described method.

The metal layer 25 that acts as the boron (B) may be formed using a deposition process, such as physical vapor deposition (PVD), e.g., plating, electroplating, electroless plating, sputtering and combinations thereof.

FIG. 2 depicts an anneal step 5 to diffuse boron (B) from the free layer 20 to the metal layer 25 comprising the boron (B) sink composition. What can be referred to as the second step of the method described with reference to FIGS. 1-5B, is an in-situ anneal step 5 at temperatures greater than 300° C. for greater than 10 minutes. The term "in-situ" means that there is no breaking of vacuum during the annealing between the formation of the metal layer 25 and the anneal step 5. For example, the annealing can be done in the different chambers of the same tool which was kept under vacuum, vs taking the wafer out of the tool, exposed to air and anneal in a different tool. During the anneal step 5, the boron (B) is expected to diffuse from the free layer 20 of the cobalt (Co), iron (Fe) and boron (B) to the metal layer 25 comprising the boron (B) sink composition, leaving crystalline CoFe as the magnetic free layer 20a. As used herein, the term crystalline denotes a material composed of a single crystal or polycrystalline crystal structure.

In some embodiments, the anneal step 5 may be at a temperature ranging from 300° C. to 600° C. In other embodiments, the anneal step 5 may be at a temperature ranging from 325° C. to 575° C. In yet other embodiments, the anneal step 5 may be at a temperature ranging from 350° C. to 550° C. In yet an even further embodiment, the anneal step 5 may be at a temperature ranging from 375° C. to 525° C.

The anneal step 5 can be for a time period ranging from 5 minutes to 30 minutes. In some embodiments, the anneal step 5 may range from 10 minutes to 20 minutes. In yet another embodiment, the anneal step 5 may be equal to 15 minutes. The above examples of anneal time are provided for illustrative purposes and are not intended to limit the present disclosure. For example, the anneal time may be modified in view of the selected anneal temperature.

The boron (B) in the free layer 20 of the alloy of cobalt (Co), iron (Fe) and boron (B) diffuses to the metal layer 25 comprising the boron (B) sink composition, wherein following the anneal process the boron (B) content in the free layer 20a of the cobalt (Co), iron (Fe) and boron (B) may be reduced to be less than 15 at. %. In some examples, the amount of boron (B) that is present in the free layer 20a of the alloy of cobalt (Co), iron (Fe) and boron (B) after the anneal process may be equal to 15 at. %, 14 at. %, 13 at. %, 12 at. %, 11 at. %, 10 at. %, 9 at. %, 8 at. %, 7 at. %, 6 at. %, 5 at. %, 4 at. %, 3 at. %, 2 at. %, or 1 at. % or any range therebetween (e.g., 15 at. % to 10 at. %, 10 at. % to 5 at. %, 5 at. % to 1 at. %), or between any of the foregoing values. In one embodiment, the boron (B) in the free layer 20 may be completely removed so that after the anneal, the boron content of the free layer 20a may be 0 at. %. For example, following the anneal, the composition of the free layer 20a may be equal to $Co_{75}Fe_{25}$.

Removing the at least a portion of boron (B) (and in some instances boron in its' entirety) from the free layer 20 of the cobalt (Co), iron (Fe) and boron (B) improves the exchange stiffness of the free layer 20. In one embodiment, following the anneal step, the exchange stiffness of the free layer may range from 5 pJ/m to 40 pJ/m. In another embodiment, following the anneal step, the exchange stiffness of the free layer may range from 8 pJ/m to 20 pJ/m.

In some embodiments, only a portion of the boron (B) in the free layer 20 of the alloy of cobalt (Co), iron (Fe) and boron (B) is converted to high stiffness crystalline material, wherein boron (B) may remain in a portion of the free layer 20.

The boron (B) that diffused into the metal layer 25 comprising the boron (B) sink composition may increase the boron (B) in the metal layer 25a to be greater than 5 at. %. In some other embodiments, the boron (B) content that is diffused into the metal layer 25a may be greater than 10 at. %. In some examples, the amount of boron (B) that is present in the metal layer 25a after anneal process may be equal to 1 at. %, 2 at. %, 3 at. %, 4 at. %, 5 at. %, 6 at. %, 7 at. %, 8 at. %, 9 at. %, 10 at. %, 11 at. %, 12 at. %, 13 at. %, 14 at. %, or 15 at. % or any range therebetween (e.g., 1 at. % to 5 at. %, 5 at. % to 10 at. %, 10 at. % to 15 at. %), or between any of the foregoing values.

FIG. 3A depicts one embodiment of etching a portion of the metal layer 25a including the boron (B) sink composition that the boron (B) from the free layer 20a has diffused to. Etching this portion can remove the boron (B) from the structure. In some embodiments, the etch process only removes a portion of the metal layer 25a, wherein a remaining portion of the metal layer 25b is present on the free layer 20a having a reduced thickness. For example, the thickness of the free layer 20a can be reduced to ¾ to ¼ its original thickness. In another example, the thickness of the free layer 20a can be equal to ½ its thickness. In some embodiments, the etch process may be an in-situ etch back process, in which the remaining portion of the metal layer 25b may range from 2 Å to 6 Å in thickness.

FIG. 3B depicts another embodiment of the present disclosure, in which the etch process removes an entirety of the metal layer 25 including the boron (B) sink composition from the structure depicted in FIG. 2. In this embodiment, the etch process may be continued to remove an entirety of the metal layer 25 including the boron that diffused into the metal layer 25 from the free layer 20a, as well as etching a portion of the free layer 20a. In this embodiment, the etch process may etching into the free layer 20a to a depth ranging up to 5 Å. The etch process for etching the free layer 20a after removing an entirety of the metal layer 25 may be any of the aforementioned anisotropic or isotropic etch processes.

FIG. 4A depicts one embodiment of forming a regrowth metal layer 30 on the remaining portion of the metal layer 25b including the boron (B) sink composition that is depicted in FIG. 3A. In this embodiment, the regrowth metal layer 30 begins the process for forming a metal oxide layer 40 atop the free layer 20a, as depicted in FIG. 5A. The regrowth metal layer 30 may have the same composition as the remaining portion of the metal layer 25b including the boron (B) sink composition. For example, when the remaining portion of the metal layer 25b is composed of tantalum (Ta), the regrowth metal layer 30 may also be composed of tantalum (Ta). The regrowth metal layer 30 may also be composed of a different composition material than the remaining portion of the metal layer 25b. It is noted that tantalum (Ta) is only one example of a material layer that may be suitable for the regrowth metal layer 30. Other material layers that can be suitable for the regrowth metal layer 30 include titanium (Ti), tantalum (Ta), zirconium (Zr) or alloys containing those elements. The regrowth metal layer 30 may be deposited using a physical vapor deposition (PVD) or chemical vapor deposition method (CVD). For example, the regrowth metal layer 30 may be formed using plating, electroplating, electroless plating, sputtering, plasma enhanced chemical vapor deposition, metal organic chemical vapor deposition, and combinations thereof. The regrowth metal layer 30 may be deposited to a thickness as great as 10 Å. In other embodiments, the regrowth metal layer 30 can be deposited to a thickness ranging from 1 Å to 5 Å.

FIG. 4B depicts another embodiment of the present disclosure, in which an iron (Fe) containing metal layer 35 is formed on the recessed remaining portion on the free layer 20b that is depicted in FIG. 3B. In one example, the iron containing metal layer 35 may be crystalline CoFe. In other examples, the iron containing alloy can be CoFeB, and may also be entirety composed iron (Fe).

In this embodiment, the iron (Fe) containing metal layer 35 is formed on the recessed remaining portion on the free layer 20b that is either entirely free of boron (B), e.g., is a cobalt (Co) and iron (Fe) crystalline material, or is crystalline cobalt (Co), iron (Fe) and boron (B) containing alloy that has a reduced boron concentration resulting from the outdiffusion methods described above. The iron (Fe) containing metal layer 35 may be formed using a deposition method, such as physical vapor deposition or chemical vapor deposition. For example, the iron (Fe) containing metal layer 35 may be deposited using plating, electroplating, electroless plating, sputtering, plasma enhanced chemical vapor deposition, metal organic chemical vapor deposition, and combinations thereof. The iron (Fe) containing metal layer 35 may be deposited to a thickness as great as 10 Å. In other embodiments, the iron (Fe) containing metal layer 35 can be deposited to a thickness ranging from 1 Å to 5 Å.

Still referring to FIG. 4B, a regrowth metal layer 30 may be formed on the iron (Fe) containing metal layer 35. In this embodiment, the regrowth metal layer 30 may also be composed of titanium (Ti), tantalum (Ta), zirconium (Zr) or alloys containing those elements. The regrowth metal layer 30 may be deposited using a physical vapor deposition (PVD) or chemical vapor deposition method (CVD). For example, the regrowth metal layer 30 may be formed using plating, electroplating, electroless plating, sputtering, plasma enhanced chemical vapor deposition, metal organic chemical vapor deposition, and combinations thereof. The regrowth metal layer 30 may be deposited to a thickness as great as 10 Å. In other embodiments, the regrowth metal layer 30 can be deposited to a thickness ranging from 1 Å to 5 Å.

FIG. 5A depicts forming a metal oxide 40 atop the free layer 20a that is depicted in FIG. 4A. FIG. 5B depicts forming a metal oxide atop the cobalt (Co) and iron (Fe) containing alloy that is depicted in FIG. 4B. The formation of the metal oxide 40 may result from exposing to an oxygen containing atmosphere or oxygen plasma. Referring to FIGS. 5A and 5B, an oxidation step may then be performed, which gives rise to perpendicular magnetic anisotropy (PMA). For stack shown in FIG. 4B and FIG. 5B, it is also possible to only grow the 0-5 Å CoFe, Fe or CoFeB and then a layer of oxide by RF sputtering. This will allow the free layer 20a to crystallize from the barrier interface for high tunnel magnetic resonance (TMR), and also improve the free layer 20a exchange stiffness, as the boron (B) content decreases in the free layer 20a.

In this embodiment, the free layer 20a comprises a crystalline cobalt and iron alloy, and an interface between the metal oxide layer 15 and the free layer provides perpendicular magnetic anisotropy character.

In some embodiments, another reference layer (also referred to as pinned layer, may be formed atop the metal oxide layer 40 that is depicted in FIGS. 5A and 5B. The above description of the reference layer identified by reference number 10 is suitable for the description of the reference layer that is depicted in FIGS. 5A and 5B.

In another aspect, a memory device is provided that includes a magnesium oxide tunnel layer atop a reference layer, and a crystalline free layer comprised of cobalt and iron alloy that is substantially free of boron, wherein the crystalline free layer is substantially lattice matched to the magnesium oxide tunnel layer. A metal oxide layer may be present on the opposite surface of the crystalline free layer to provide an oxide interface on opposing surfaces of the crystalline free layer in order to generate perpendicular magnetic anisotropy character.

The methods and structures that have been described above with reference to FIGS. 1-5A may be employed in any electrical device. For example, the memory devices that are disclosed herein may be present within electrical devices that employ semiconductors that are present within integrated circuit chips. The integrated circuit chips including the disclosed interconnects may be integrated with other chips, discrete circuit elements, and/or other signal processing devices as part of either (a) an intermediate product, such as a motherboard, or (b) an end product. The end product can be any product that includes integrated circuit chips, including computer products or devices having a display, a keyboard or other input device, and a central processor.

It should be further understood that STT MRAM devices according to the present principles can be employed in any computing apparatus that utilizes RAM. For example, such computing apparatuses can utilize the STT MRAM devices in lieu of or in addition to RAM. Such computing apparatuses can include personal computers, mainframes, laptops, smart phones, tablet computers and other computing devices.

Having described preferred embodiments of STT MRAM devices, apparatuses and manufacturing methods (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a memory device comprising:
providing a single free layer of an alloy of at least one of cobalt (Co), iron (Fe) and boron (B) in direct contact with a metal oxide layer that is atop a reference layer;
depositing a metal layer comprising a boron (B) sink composition atop the free layer;
annealing to diffuse the boron (B) from the free layer to the metal layer comprising the boron sink composition, wherein the depositing the metal layer and the annealing to diffuse boron from the free layer to the metal layer is conducted in situ, the annealing having a duration ranging from 15 minutes to 30 minutes;
removing the metal layer comprising the boron (B) sink composition, the remaining composition of the single free layer is said cobalt (Co) and said iron (Fe) that is crystalline and from which boron (B) has been removed;
forming an iron containing metal layer of cobalt ferrite (CoFe) in direct contact with an exposed surface of the free layer after said removing the metal layer comprising the boron sink composition; and
forming a top metal oxide comprising zirconium oxide (ZrO), wherein the ZrO is directly atop the iron containing metal layer, wherein the free layer comprises a crystalline cobalt and iron alloy, and an interface between the top metal oxide and the iron containing metal layer provides perpendicular magnetic anisotropy character.

2. The method of claim 1, wherein the free layer comprises CoFeB.

3. The method of claim 1, wherein the free layer is present atop the metal oxide layer that is present atop the reference layer.

4. The method of claim 3, wherein the metal oxide layer comprises magnesium oxide and the reference layer comprises at least one of Fe, Ni, Co, Cr, V, Mn, Pd, Pt, B, O and N.

5. The method of claim 1, wherein the boron sink composition comprises titanium (Ti), tantalum (Ta), zirconium (Zr) or alloys thereof.

6. The method of claim 1, wherein said forming the top metal oxide atop the free layer comprises exposure to oxygen, oxygen plasma or RF sputtering.

7. The method of claim 1, wherein the removing of the metal layer comprising the boron (B) sink composition comprises etching.

8. The method of claim 1, wherein the iron containing metal layer comprises cobalt and iron.

9. The method of claim 1, wherein the iron containing metal layer is crystalline.

10. The method of claim 1, wherein following said annealing to diffuse the boron (B) from the free layer to the metal layer comprising the boron sink composition, the free layer comprises CoFe.

11. A memory device comprising:
a magnesium oxide tunnel layer atop a reference layer;
a single crystalline free layer comprised of a cobalt and iron alloy that is substantially free of boron, wherein the single crystalline free layer is in direct contact with and substantially lattice matched to the magnesium oxide tunnel layer;
a regrowth metal layer having a thickness ranging from 1 Å to 5 Å on a surface of the single crystalline free layer, wherein the regrowth metal layer is comprised of cobalt ferrite (CoFe); and
a metal oxide layer comprising zirconium oxide (ZrO), wherein the ZrO is directly on the regrowth metal layer to provide an oxide interface on two opposing surfaces of the single crystalline free layer in order to generate perpendicular magnetic anisotropy character at both interfaces.

12. The memory device of claim 11, wherein the single crystalline free layer is CoFe.

13. The memory device of claim 11, wherein the single crystalline free layer has a thickness ranging from 5 Å to 30 Å.

14. The memory device of claim 11, wherein the reference layer comprises a material selected from the group consisting of Fe, Ni, Co, Cr, V, Mn, Pd, Pt, B, O and N.

15. The memory device of claim 11, wherein the metal oxide layer has a thickness ranging from 5 A to 20 A.

16. A memory device comprising:
a single crystalline free layer comprised of a cobalt and iron alloy that is substantially free of boron, wherein the crystalline free layer is substantially lattice matched to a magnesium oxide tunnel layer;
a regrowth metal layer having a thickness ranging from 1 Å to 5 Å on a surface of the single free layer, wherein the regrowth metal layer is comprised of cobalt ferrite (CoFe); and
metal oxide layers including said magnesium oxide tunnel layer present on opposite surfaces of the single crystalline free layer to provide an oxide interface on two opposing surfaces of the single crystalline free layer in order to generate perpendicular magnetic anisotropy character at both interfaces in a metal stack for a spin torque transfer magnetic random access memory device, the metal stack including said magnesium oxide tunnel layer from said metal oxide layers in direct contact with a first side of the single crystalline free layer, and a second metal oxide layer comprising zirconium oxide (ZrO) from said metal oxide layers, wherein the ZrO is in direct contact with the regrowth metal layer on a second side of the single crystalline free layer.

17. The memory device of claim 16, wherein the single crystalline free layer is CoFe.

18. The memory device of claim 17, wherein the single crystalline free layer has a thickness ranging from 5 Å to 30 Å.

19. The memory device of claim 16, further comprising a reference layer underlying the magnesium oxide tunnel layer, wherein the reference layer comprises a material selected from the group consisting of Fe, Ni, Co, Cr, V, Mn, Pd, Pt, B, O and N.

* * * * *